United States Patent [19]

Main

[11] 4,109,214
[45] Aug. 22, 1978

[54] UNBALANCED-TO-BALANCED SIGNAL CONVERTER CIRCUIT

[75] Inventor: W. Eric Main, Mesa, Ariz.

[73] Assignee: Motorola, Inc., Schaumburg, Ill.

[21] Appl. No.: 802,170

[22] Filed: May 31, 1977

[51] Int. Cl.² .......................... H03F 3/45; H03F 3/04; H03G 3/00
[52] U.S. Cl. .................................. 330/254; 330/257; 330/288; 330/301; 333/80 T
[58] Field of Search ............... 330/117, 254, 257, 288, 330/301; 333/80 T

[56] References Cited
U.S. PATENT DOCUMENTS

| | | | |
|---|---|---|---|
| 3,560,866 | 2/1971 | Haines | 330/254 |
| 3,573,645 | 4/1971 | Wheatley | 330/273 |
| 4,039,981 | 8/1977 | Ohashi | 333/80 T X |

*Primary Examiner*—James B. Mullins
*Attorney, Agent, or Firm*—Maurice J. Jones, Jr.

[57] ABSTRACT

The disclosed unbalanced-to-balanced signal converter circuit includes two pairs of transistors, each pair having first and second transistors with the base-to-emitter junctions of each pair being connected in series between a reference potential point and a constant current source. A driver circuit is arranged to supply an unbalanced input signal which increases the conductivities of the first transistor of the first pair and the second transistor of the second pair, while decreasing the conductivities of the second transistor of the first pair and the first transistor of the second pair, and vice versa. Balanced linear output signals are provided at the collectors of the second pair of transistors. A gain controlled amplifier and a capacitance control circuit each including the unbalanced-to-balanced converter are also disclosed.

19 Claims, 3 Drawing Figures

UNBALANCED-TO-BALANCED SIGNAL CONVERTER CIRCUIT

BACKGROUND OF THE INVENTION

Modern electronic systems and particularly those implemented in monolithic integrated circuit form require circuits for converting an unbalanced or single-ended signal which is asymmetrical with respect to a common reference point, into a balanced or differential signal which is symmetrical with respect to the common reference point. The common reference point can be a ground potential, for instance. More particularly, in some applications, such circuits are sometimes required to provide two output currents one of which has a magnitude that varies as the magnitude of the input current and the other of which has a magnitude that varies by the same amount as the magnitude of the input current, but in the opposite direction. For example, if the magnitude of the input current increases by a predetermined amount the magnitude of the first output current is also desired to increase by the predetermined amount and the magnitude of the second output current is desired to decrease by the same predetermined amount. Hence, the magnitudes of the differential output currents are desired to be linear functions of the magnitude of the single-ended input current.

In the prior art, a differential amplifier having one input terminal grounded is sometimes utilized for converting an unbalanced input signal, which is applied to the other input terminal, into a balanced signal. The balanced output signal occurs between the output terminals of the differential amplifier. Generally, the magnitude of the balanced output voltages of such differential amplifiers have logarithmic relations to the magnitudes of the input voltages. Thus, the prior art configuration provides a differential output voltage which has a magnitude that is a nonlinear function of the magnitude of the input voltage. More specifically, if the magnitude of the input voltage is increased by a predetermined amount, the prior art differential amplifier provides differential output voltages having magnitudes which do not change by the predetermined amount. Consequently such prior art amplifiers are not suitable for some of the aforementioned applications requiring differential, linear currents, for instance.

SUMMARY OF THE INVENTION

One object of the invention is to provide an unbalanced-to-balanced signal converter circuit configuration.

Another object of the invention is to provide an unbalanced-to-balanced converter circuit which develops differential or balanced output signals which vary as a substantially linear function of the input signal.

A further object of the invention is to provide an unbalanced-to-balanced converter circuit which develops differential output signals and wherein one of the output signals has substantially the same instantaneous magnitude as the input signal.

A still further object of the invention is to provide an unbalanced-to-balanced converter circuit which is suitable for being manufactured in monolithic integrated circuit form.

An additional object of the invention is to provide an unbalanced-to-balanced current converter circuit which is suitable for being included in a controlled gain circuit having substantially constant quiescent output levels.

A still additional object of the invention is to provide an unbalanced-to-balanced current converter circuit which is suitable for being utilized in a circuit for providing a capacitance having a controlled magnitude.

Briefly, the unbalanced-to-balanced signal converter circuit of one embodiment includes a first pair of transistors coupled to a driver circuit which provides an unbalanced input signal. The first pair of transistors is interconnected so that one is rendered conductive while the other is rendered nonconductive by the input signal. One of the first pair of transistors is connected to a constant current supply. A second pair of transistors is coupled to the first pair of transistors and interconnected such that one of the second pair of transistors is rendered conductive while the other is rendered nonconductive. One of the second pair of transistors is also connected to the constant current supply.

The second pair of transistors provides the balanced output signals.

DETAILED DESCRIPTION OF THE PREFERRED EMBODIMENTS

Figure 1:
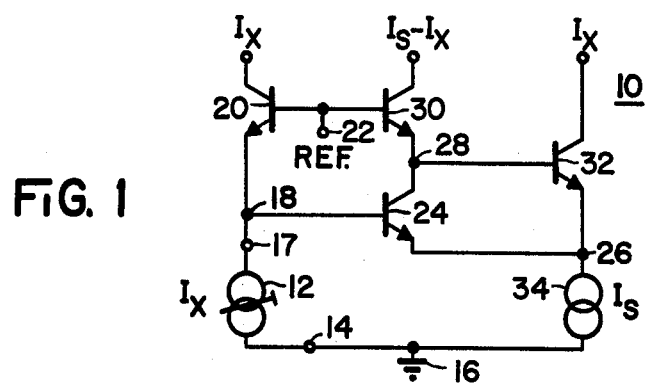
FIG. 1 is a diagram of an unbalanced-to-balanced converter circuit of one embodiment of the invention.

FIG. 1 is a diagram of unbalanced-to-balanced converter circuit 10 of one embodiment of the invention. Variable current source or driver 12 includes terminal 14 which is connected to ground or reference potential conductor 16. Terminal 17 of current circuit 12 is connected to input terminal 18 of converter 10. Current source or supply 12 is a single-ended driving supply which draws an unbalanced control current from input terminal 18.

Circuit 10 includes two pairs of alternately conductive bipolar transistors. NPN transistor 20 includes an emitter electrode connected to input terminal 18, a base electrode connected to reference supply terminal 22 and a collector electrode connected or coupled to a positive power supply conductor. NPN transistor 24 includes a base electrode connected to input terminal 18, an emitter electrode connected to terminal 26 and a collector electrode connected to node or terminal 28. Transistors 20 and 24 comprise the first pair of alternately conductive transistors. NPN transistor 30 includes a base electrode connected to reference terminal 22, an emitter electrode connected to node 28 and a collector electrode connected or coupled to the positive power supply conductor. Transistor 32 includes a base electrode connected to node 28, an emitter electrode connected to terminal 26 and a collector electrode connected or coupled to the positive power supply conductor. Transistors 30 and 32 comprise the second pair of alternately conductive transistors.

Current control circuit 34 which is connected between terminal 26 and conductor 16, draws a substantially constant current from terminal 26 and hence from transistors 24 and 32 during the energization of circuit 10. Generally, the collector electrodes of transistors 30 and 32 or 20 and 30 form the output terminals of circuit 10 at which balanced currents are provided in response to an unbalanced current at terminal 18.

QUIESCENT OPERATION

The quiescent operation of circuit 10 will now be considered. It is assumed that the magnitudes of the base currents of transistors 20, 30, 24 and 32 of circuit 10 are negligible. Hence, that the emitter current of each transistor is equal to the collector current thereof. The emitter and collector current of a given transistor is referred to herein as the "main current" of that transistor. Also the voltage across the base-to-emitter junctions of transistors 20, 30, 24 and 32 are all assumed to be equal for equal main currents. In view of these assumptions, the main currents of transistors 24 and 30 have equal magnitudes since the emitter of transistor 30 is connected to the collector of transistor 24. Also, the sum of the main currents of transistors 24 and 32 equal the constant current ($I_S$) required by constant current supply circuit 34. Since the voltage drop between terminals 22 and 26 must be constant, regardless of the path taken therebetween, the sum of the base-to-emitter voltages of transistors 20 and 24 of the first pair must at all times equal the sum of the base-to-emitter voltages of transistors 30 and 32 of the second pair. Therefore, the products of the magnitudes of the main currents of the first pair of transistors 20 and 24 must equal the products of the magnitudes of the main currents of the second pair of transistors 30 and 32. Since the magnitudes of the main currents of transistors 24 and 30 are equal to each other, the magnitudes of the currents of transistors 20 and 32 must also be equal to each other. Thus, during quiescent conditions, if current driving circuit 12 provides a current ($I_X$) which has a magnitude of half the current ($I_S$) of constant current source 34, then the main currents of transistors 20, 30, 24 and 32 all have magnitudes equal to $I_X$.

DYNAMIC OPERATION

During dynamic operation, circuit 10 responds to changes in the magnitude of the unbalanced current, $I_X$ conducted by current source 12 by providing a similarly varying balanced output current, $I_X$ at the collector of transistor 32 and an oppositely varying balanced output current, ($I_S - I_X$) at the collector of transistor 30. More specifically, if the magnitude of the current, $I_X$ conducted by current supply 12 increases by a predetermined amount, transistor 20 of the first pair will be rendered more conductive and transistor 24 of the first pair will be rendered less conductive. The decrease in conductivity of transistor 24 accompanies the increase of the collector voltage thereof, which results in transistor 32 of the second pair being rendered more conductive so that the main current thereof also increases by the predetermined amount. Also, the increase in collector voltage of transistor 24 causes transistor 30 of the second pair to be rendered less conductive so that the main current therethrough decreases by the predetermined amount. Thus, under these conditions transistor 32 provides more of the current $I_S$ required by source 34 than does transistor 24.

Alternatively, if the input current provided by supply 12 decreases in magnitude by a predetermined amount, the emitter current of transistor 20 also decreases by the predetermined amount. Consequently, transistors 24 and 30 are rendered more conductive so that transistor 24 provides more of the constant current $I_S$ required by constant current control circuit 34. The main currents of transistors 24 and 30 increase by the predetermined amount. Moreover, transistor 32 is rendered less conductive by the decrease in collector voltage of transistor 24 so that the magnitude of the collector current of transistor 32 decreases by the predetermined amount.

Thus, the main or collector current of transistor 30 increases by an amount equal to the decrease in the magnitude of the current of current supply circuit 12 and the main or collector current of transistor 32 decreases by an amount equal to the decrease in current of transistor 12. Consequently, the collector electrodes of transistors 30 and 32 each conduct a differential or balanced current which is a linear function of the single-ended or unbalanced current $I_X$ of variable current supply or driver 12. The magnitude of the collector current, $I_X$ of transistor 32 is substantially identical to control current $I_X$ of source 12. Thus, the collector current of transistors 24 and 30 is substantially equal to $I_S - I_X$. Although circuit 10 has been described in terms of current, it could be adapted for converting unbalanced voltages into balanced voltages by the appropriate use of resistors or other impedance components.

CONTROLLED GAIN CIRCUIT

Figure 2:
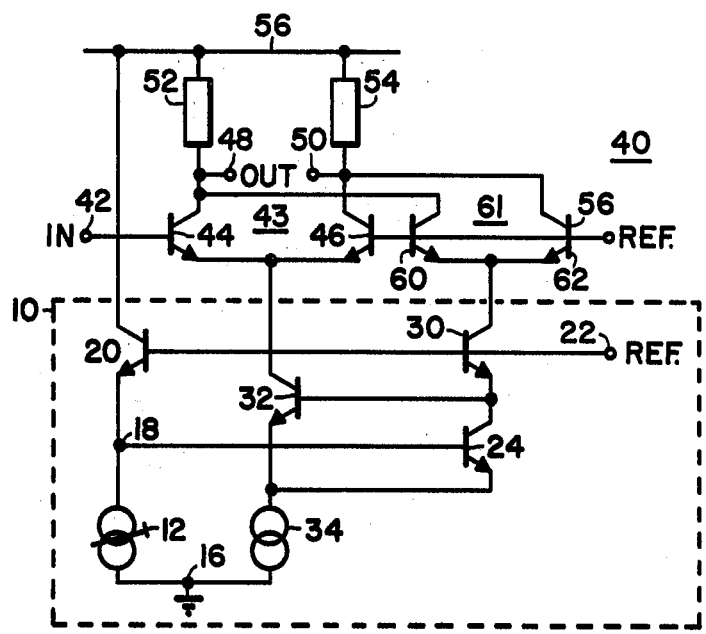
FIG. 2 is a diagram of a controlled gain circuit which utilizes the circuit of FIG. 1.

Circuit 10 has a plurality of applications. Specifically, circuit 10 forms part of controlled gain circuit 40 of FIG. 2. The corresponding components of circuit 10 of FIGS. 1 and 2 have identical reference numbers. Terminal 42 is the input terminal of differential amplifier 43 including the differentially connected pair of NPN transistors, 44 and 46. The common emitter electrodes of transistors 44 and 46 are connected to the collector electrode of transistor 32 of circuit 10 and the collector electrodes of transistors 44 and 46 are connected to output terminals 48 and 50. Load resistors 52 and 54 are respectively connected between the collectors of transistors 44 and 46, and positive power supply conductor 56. The collector electrode of transistor 20 is also connected to positive power supply conductor 56. Transistor 32 forms the current source or control circuit for differential pair 44 and 46. The base electrode of transistor 46 is connected to terminal 56 to receive a reference potential provided by any one of a plurality of known bias circuits, which are not shown. As the current through current source 32 is changed in magnitude, the gain of the differential pair 43 changes in a known manner.

As the magnitude of the current through transistor 32 is varied, the magnitude of the currents conducted by transistors 44 and 46 under quiescent conditions also vary. Thus, the quiescent output voltage at terminals 48 and 50 also tend to vary. More specifically, the potential at terminal 48 and at terminal 50 tends to decrease in magnitude as current circuit 32 draws more current through differential pair 43 and through resistors 52 and 54. Also the potential at terminals 48 and 50 tends to increase as the current through current source 32 is decreased.

It is important for the quiescent or DC voltages at output terminals 48 and 50 to remain constant even though the gain of differential amplifier 43 is adjusted to enable design of circuitry directly coupled to terminals 48 and 50. The controlled gain circuit of FIG. 2 utilizes unbalanced-to-balanced signal converter circuit 10 to respond to an unbalanced gain control circuit provided by supply 12 by providing a first differential signal through transistor 32 which controls the gain of differential pair 44 and 46 and a second differential signal through transistor 30 which enables the quiescent output voltages at terminals 48 and 50 to remain constant while the gain is changed.

In particular, differential pair 61, which is comprised of transistors 60 and 62, cooperates with circuit 10 to enable the quiescent potentials at terminals 48 and 50 to remain constant even though the current through control transistor 32 is varied. As the current through transistor 32 is decreased, the current through transistor 30 increases, as previously explained, to compensate for the decrease in current which would otherwise result in a change in the direct current (DC) voltage across load resistors 52 and 54. Similarly, as the current through transistor 32 is increased, the current through transistor 30 is decreased thereby causing transistors 60 and 62 to conduct less current from respective load resistors 52 and 54. Hence, the quiescent current through and the DC voltage across load resistors 52 and 54 is kept constant by circuit 10.

CONTROLLED CAPACITANCE CIRCUIT

Figure 3:
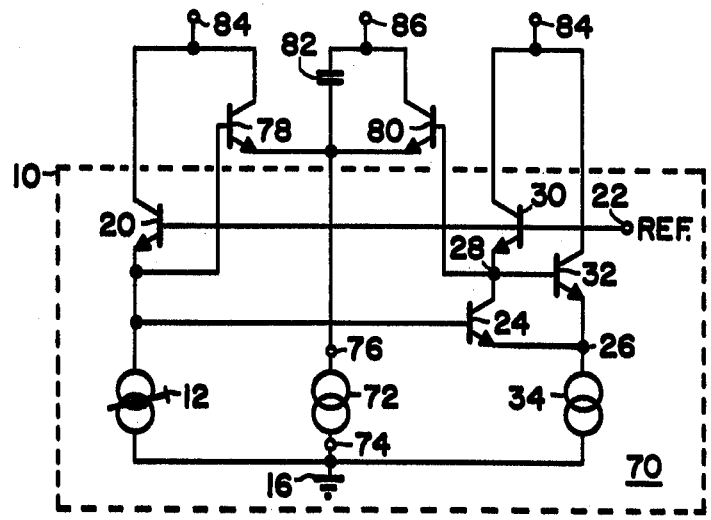
FIG. 3 is a diagram of a controlled variable capacitance circuit which utilizes the circuit of FIG. 1.

FIG. 3 is a diagram of circuit 70 which utilizes circuit 10 to facilitate the generation of a controlled, variable capacitance. The corresponding components of circuit 10 of FIG. 1 and FIG. 3 have the same reference numbers. Circuit 70 includes a constant current control circuit or source 72 having one terminal 74 connected to ground or reference potential conductor 16 and another terminal 76 connected to the commonly connected emitters of differentially connected NPN transistors 78 and 80. The base electrode of transistor 78 is connected to the emitter electrode of transistor 20 and to the base electrode of transistor 24, and the base electrode of transistor 80 is connected to the emitter electrode of transistor 30 and to the base electrode of transistor 32. Capacitor 82 is connected between the emitter and collector electrodes of transistor 80. The collector electrodes of transistors 20, 78, 30 and 32 are all connected to positive power supply conductor 84. Output terminal 86 is connected to external circuitry, not shown, of a known form such as a variable frequency oscillator, which requires an electronically controllable variable capacitance.

In operation, an unbalanced capacitance control signal is provided by circuitry which is diagramatically designated as variable current source 12. The value of the capacitance at output terminal 86 depends upon the relative amounts of the current of constant current source 72 being conducted by differential transistors 78 and 80. If transistor 78 is rendered more conductive than transistor 80 then the value of the effective capacitance at terminal 86 is more than one half the capacitance of capacitor 82, for instance. Since the base electrode of transistor 78 is connected to the base electrode of transistor 24 and since the base electrode of transistor 80 is connected to the base electrode of transistor 32, the ratio of the main current in transistor 78 to the main current in transistor 80 will always be equal to the ratio of the main current in transistor 24 to the main current in transistor 32, assuming that transistor 78 is identical to transistor 80. Thus a change in the control current of supply 12 causing the main current of transistor 24 to change relative to the main current of transistor 30 will also cause the main current of transistor 78 to change relative to the main current of transistor 80 which in turn weill cause a change in the effective value of the capacitor at terminal 82.

If transistors 78 and 80 are equally conductive, the value of the effective capacitance at 86 is one half of the capacitance of capacitor 82. If transistor 78 is fully nonconductive and transistor 80 is conductive then the value of the effective capacitance at terminal 86 is substantially equal to the value of the capacitance of capacitor 82 divided by the beta of transistor 80. Alternatively, if transistor 80 is fully nonconductive and transistor 78 is conductive then the effective capacitance at terminal 86 is substantially equal to the capacitance of capacitor 82. Thus, circuit 70 facilitates a maximum useful range of values for capacitor 82. The effective capacitance at terminal 86 varies in a linear manner with the variation of the magnitude of the control current of supply 12. Prior art circuits utilizing unbalanced control of a differential amplifier tend to limit the range of the values of the effective capacitance and tend to provide nonlinear variations of effective capacitance as a function of control signal change. Circuit 70 can be used to provide a variable inductance or a variable resistance by respectively substituting an inductor or a resistor for capacitor 82.

What has been described is an unbalanced-to-balanced signal converter circuit 10, which develops differential or balanced output signals at the collectors or transistors 30 and 32. The magnitudes of the output signals vary as a substantially linear function of the magnitude of the input signal provided by variable current driver 12. The differential output signal at the collector of transistor 32 varies with and has substantially the same instantaneous magnitude as the input signal provided by control current supply 12. Circuit 10 has a configuration which is suitable for being manufactured in monolithic integrated circuit form. Also, circuit 10 forms part of controlled gain circuit 40 of FIG. 2 and of controlled capacitance circuit 70 of FIG. 3.

What is claimed is:

1. An unbalanced-to-balanced current converter circuit having a pair of balanced output signals with magnitudes the sum of which is virtually equal to the magnitude of a control signal, including in combination:

driver circuit means for providing an unbalanced current control signal;

current control circuit means for providing the control signal;

first and second transistors each having emitter, base and collector electrodes, said first and second transistors being coupled to said driver circuit means and interconnected such that one of said first and second transistor is rendered conductive while the other is rendered nonconductive, said emitter-to-collector path of said second transistor being electrically coupled to said current control circuit means; and third and fourth transistors each having emitter, base and collector electrodes, said third and fourth transistors being interconnected with said first and second transistors such that one of said third and fourth transistors is rendered conductive while the other is rendered nonconductive, said collector-to-emitter path of said fourth transistor being electrically coupled in parallel with said collector-to-emitter path of said second transistor so that the sum of the emitter currents of said second and fourth transistors virtually equals the magnitude of the control signal, said third transistor having a conductivity which is proportional to the conductivity of said second transistor so that said third transistor provides one of the balanced output signals and said fourth transistor having a conductivity which is proportional to the conductivity of said first transistor so that one of said first and fourth transistor provides the other balanced output signal.

2. The unbalanced-to-balanced current converter circuit of claim 1 further including:
reference supply means;
said base electrode of said first transistor being coupled to said reference supply means and said emitter electrode of said first transistor being coupled to said base electrode of said second transistor, said emitter electrode of said second transistor being coupled to a circuit node; and
said base electrode of said third transistor being connected to said reference supply means and said emitter electrode of said third transistor being coupled to said base electrode of said fourth transistor, said emitter electrode of said fourth transistor being coupled to said circuit node, the sum of the base-to-emitter voltages of said first and second transistors thereby being equal to the sum of the base-to-emitter voltages of said third and fourth transistors so that the products of the magnitudes of the currents of said first and second transistors is equal to the products of the magnitudes of the currents of said third and fourth transistors.

3. The unbalanced-to-balanced signal converter circuit of claim 1 wherein said collector electrode of said second transistor is connected to said emitter electrode of said third transistor.

4. The unbalanced-to-balanced signal converter circuit of claim 1 wherein said driver circuit means is connected to said emitter electrode of said first transistor and said base electrode of said second transistor.

5. An amplifier circuit having controlled gain and providing a constant quiescent output voltage at the output terminals thereof, including in combination:
a first differential pair of transistors having commonly connected emitter electrodes and collector electrodes connected to the amplifier output terminals;
power supply conductor means;
load resistor means coupling said collector electrodes of said first differential pair of transistors to said power supply conductor means;
a second differential pair of transistors having collector electrodes electrically coupled to said collector electrodes of said first differential pair of transistors and commonly connected emitter electrodes;
driver circuit means for providing the gain control signal; and
unbalanced-to-balanced current converter circuit means having an input terminal coupled to said driver circuit means, a first output terminal connected to said first differential pair and a second output terminal connected to said second differential pair, said unbalanced-to-balanced signal converter circuit means further including: constant signal control means; first and second electron control means coupled to said driver circuit means and interconnected such that one is rendered conductive while the other is rendered nonconductive, said second electron control means being coupled to said constant signal control means; and third and fourth electron control means coupled to said first and second electron control means and interconnected such that one is rendered conductive while the other is rendered nonconductive, said fourth electron control means being coupled to said constant signal control means, said third electron control means having a conductivity controlled by said conductivity of one of said first and second electron control means so that said third electron control means provides one of the balanced signals and said fourth electron control means provides the other of the balanced signals.

6. The amplifier circuit of claim 5 wherein said driver circuit means includes a variable current supply.

7. The amplifier circuit of claim 5 further including:
reference supply means; and
wherein said first and second electron control means respectively include first and second transistors each having emitter, base and collector electrodes, said base electrode of said first transistor being coupled to said reference supply means and said emitter electrode of said first transistor being coupled to said base electrode of said second transistor, and said emitter electrode of said second transistor being connected to said constant signal control means.

8. The amplifier circuit of claim 7 wherein said driver circuit means is coupled to said emitter electrode of said first transistor and to said base electrode of said second transistor.

9. The amplifier circuit of claim 5 further including:
reference supply means; and
wherein said third and fourth electron control means respectively include third and fourth transistors, said third and fourth transistors each having emitter, base and collector electrodes, said base electrode of said third transistor being connected to said reference supply means and said emitter electrode of said third transistor being connected to said base electrode of said fourth transistor, and said emitter electrode of said fourth transistor being connected to the constant signal control means.

10. An electronically controllable variable impedance circuit, including in combination:
a pair of differentially connected transistors having commonly connected emitter electrodes and base electrodes and collector electrodes;
means for electrically connecting an impedance between said emitter electrode and said collector electrode of one of said differentially connected transistors;
constant current supply means connected to said commonly connected emitter electrodes of said pair of differentially connected transistors;
driver circuit means for providing an unbalanced capacitance control signal; and
unbalanced-to-balanced signal converter circuit means having an input terminal connected to said driver circuit means and output terminals connected to said pair of differentially connected transistors, said unbalanced-to-balanced signal converter circuit means further including constant signal control means; first and second electron control means coupled to said driver circuit means and interconnected such that one is rendered conductive while the other is rendered nonconductive, said second electron control means being coupled to said constant signal control means; and third and fourth electron control means coupled to said first and second electron control means and interconnected such that one is rendered conductive while the other is rendered nonconductive, said fourth electron control means being coupled to said constant signal control means, said third electron control means having a conductivity controlled by said conductivity of one of said first and second electron control means so that said third electron control means provides one of the balanced signals and said fourth electron control means provides the other of the balanced signals.

11. The variable impedance circuit of claim 10 wherein said driver circuit means includes a variable current supply.

12. The variable impedance circuit of claim 10 further including:
reference supply means; and
wherein said first and second electron control means respectively include first and second transistors each having emitter, base and collector electrodes, said base electrode of said first transistor being coupled to said reference supply means and said emitter electrode of said first transistor being coupled to said base electrode of said second transistor, and said emitter electrode of said second transistor being connected to said constant signal control means.

13. The variable impedance circuit of claim 12 wherein said driver circuit means is coupled to said emitter electrode of said first transistor and to said base electrode of said second transistor.

14. The variable impedance circuit of claim 10 further including:
reference supply means; and
wherein said third and fourth electron control means respectively include third and fourth transistors, said third and fourth transistors each having emitter, base and collector electrodes, said base electrode of said third transistor being connected to said reference supply means and said emitter electrode of said third transistor being connected to said base electrode of said fourth transistor, and said emitter electrode of said fourth transistor being connected to the constant signal control means.

15. An unbalanced-to-balanced signal converter circuit for providing a pair of balanced output signals with magnitudes the sum of which is virtually equal to the magnitude of a control signal, including in combination:
driver circuit means for providing the unbalanced signal;
signal control means for providing the control signal;
first and second electron control means each having main electrodes and a control electrode, said control electrodes of said first and second electron control means being electrically coupled to said driver circuit means such that one is rendered conductive while the other is rendered non-conductive, said first electron control means conducting a signal having a magnitude substantially equal to the magnitude of the unbalanced signal, said main electrodes of said second electron control means being electrically coupled with said signal control means; and third and fourth electron control means each having main electrodes and a control electrode, said third and fourth electron control means being electrically coupled to said first and second electron control means such that one is rendered conductive while the other is rendered nonconductive, said main electrodes of said third electron control means being electrically coupled in series with said main electrodes of said second electron control means so that the signals through said second and third electron control means constantly have virtually equal magnitudes, said main electrodes of said fourth electron control means being electrically coupled to said signal control means in parallel with said main electrodes of said second electron control means so that the magnitude of the signals through said second and fourth electron control means virtually equals the magnitude of said control signal, said control electrode of said fourth electron control means being electrically coupled to said first and second electron control means such that said fourth electron control means conducts a current having a magnitude virtually equal to the magnitude of the unbalanced input signal so that said third electron control means provides one of the balanced output signals and one of said first and fourth electron control means provides the other of the balanced output signals, the sum of the magnitudes of the balanced output signals thereby being virtually equal to the magnitude of the control signal.

16. The unbalanced-to-balanced signal converter circuit of claim 15 wherein said driver circuit means includes a variable current supply.

17. The unbalanced-to-balanced signal converter circuit of claim 15 further including:
reference supply means; and
wherein said first and second electron control means respectively include first and second transistors each having emitter, base and collector electrodes, said base electrode of said first transistor being coupled to said reference supply means and said emitter electrode of said first transistor being coupled to said base electrode of said second transistor, and said emitter electrode of said second transistor being connected to said signal control means.

18. The unbalanced-to-balanced signal converter circuit of claim 17 wherein said driver circuit means is coupled to said emitter electrode of said first transistor and to said base electrode of said second transistor.

19. The unbalanced-to-balanced signal converter circuit of claim 15 further including:
reference supply means; and
wherein said third and fourth electron control means respectively include third and fourth transistors, said third and fourth transistors each having emitter, base and collector electrodes, said base electrode of said third transistor being connected to said reference supply means and said emitter electrode of said third transistor being connected to said base electrode of said fourth transistor, and said emitter electrode of said fourth transistor being connected to the signal control means.

* * * * *